(12) United States Patent
Trout et al.

(10) Patent No.: US 7,170,169 B2
(45) Date of Patent: Jan. 30, 2007

(54) LGA SOCKET WITH EMI PROTECTION

(75) Inventors: David A Trout, Lancaster, PA (US); Richard N Whyne, Camp Hill, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/078,957

(22) Filed: Mar. 11, 2005

(65) Prior Publication Data

US 2006/0220239 A1   Oct. 5, 2006

(51) Int. Cl.
*H01L 23/48* (2006.01)
*H01L 23/52* (2006.01)
*H01L 29/40* (2006.01)
*H01L 23/34* (2006.01)

(52) U.S. Cl. .............. 257/734; 257/726; 257/727; 257/735; 257/736; 257/737; 257/780; 257/781

(58) Field of Classification Search ........ 257/734–737, 257/780–781, 726–727
See application file for complete search history.

(56) References Cited

U.S. PATENT DOCUMENTS

| | | | | |
|---|---|---|---|---|
| 6,042,412 A | * | 3/2000 | Murr | 439/331 |
| 6,224,392 B1 | * | 5/2001 | Fasano et al. | 439/66 |
| 6,375,476 B1 | * | 4/2002 | Goodwin et al. | 439/71 |
| 6,558,169 B2 | * | 5/2003 | Figueroa et al. | 439/70 |
| 6,586,684 B2 | * | 7/2003 | Frutschy et al. | 174/260 |
| 6,659,512 B1 | * | 12/2003 | Harper et al. | 257/777 |
| 6,706,562 B2 | * | 3/2004 | Mahajan et al. | 438/125 |
| 6,735,085 B2 | * | 5/2004 | McHugh et al. | 361/719 |
| 6,792,375 B2 | * | 9/2004 | Colbert et al. | 702/117 |
| 6,800,947 B2 | * | 10/2004 | Sathe | 257/780 |
| 6,929,495 B2 | * | 8/2005 | Ma | 439/331 |
| 7,083,456 B2 | * | 8/2006 | Trout et al. | 439/326 |
| 2005/0207133 A1 | * | 9/2005 | Pavier et al. | 361/761 |

* cited by examiner

*Primary Examiner*—IDA M. Soward

(57) ABSTRACT

A socket is provided which has an insulative housing surrounding a metal substrate. The substrate has an array of apertures which are located in spatially arranged order to accommodate the precise pattern desired for the device to be connected. Contact assemblies include stamped and formed contacts having an insulative plastic molded over a central section of the contact. A grounding clip surrounds the housing and is conductively connected to the substrate, and has spring arms which are connectable to heat sink hardware on one side thereof and to a printed circuit board on the other side.

21 Claims, 5 Drawing Sheets

LGA SOCKET WITH EMI PROTECTION

BACKGROUND OF THE INVENTION

The subject invention relates to a Land Grid Array (LGA) socket and a substrate ground clip for the integrity of the electrical signals passing through the array.

Various packages or devices exist within the computer industry which require interconnection to a printed circuit board. These devices have lands or balls which are placed on various centerline spacings, some of which are at approximately 1.0-mm centerline spacing, and some above and below that centerline spacing. These devices are profiled with arrays of 50 by 50 and even greater. Given the plurality of lands, their centerline spacing, and given the force applied to each land, this device causes a variety of problems in practice in connection to the printed circuit board.

Sockets exist within the market for the interconnection of such devices, and can include a substrate having a plurality of contacts positioned in an array. If the array is metal, there is a possibility that the electrical signals passing through the contacts may include electromagnetic waves on the surface of the metal substrate. The noise from these waves could negatively affect the performance of the interconnection.

These and other problems are addressed by the present invention.

SUMMARY OF THE INVENTION

The objects have been accomplished by providing an LGA interconnect, comprising a substrate and a plurality of contact assemblies. The substrate has the contact assemblies arranged in an array, each contact assembly comprised of at least one metal contact being positioned on the substrate, positioning a first contact member of the metal contact above the substrate and a second contact of the metal contact below the substrate. A housing assembly is positioned around a substantial periphery of the substrate, and a grounding clip is attached to the substrate and extends around a substantial portion of the housing to protect the substrate from electromagnetic interference.

The LGA interconnect may have a rigid substrate, and may be comprised of metal. The LGA interconnect may also have an insulative housing comprised of two housing halves.

The LGA interconnect grounding clip may include integral tabs which are trapped between the housing halves. The LGA interconnect substrate may also be metal with the integral tabs grounded to the substrate.

The LGA interconnect grounding clip may include a planar wall portion which substantially covers an outer wall of the housing assembly. The grounding clip may also include spring members extending from upper and lower ends of the planar wall portion.

The LGA interconnect may be profiled wherein the housing assembly is rectangular and includes a grounding clip along all of the outer walls.

In another embodiment of the invention, an LGA interconnect, comprises a metal substrate having an upper surface and a lower surface, and a plurality of contact assemblies. Each contact assembly is comprised of at least one metal contact and an insulative member, the metal contacts being connected to the substrate by the insulative member. A conductive grounding clip is attached to, and is grounded to, the substrate.

The LGA interconnect may further comprise an insulative housing assembly positioned around a substantial periphery of the substrate, and may be comprised of two housing halves. The LGA interconnect grounding clip may include integral tabs which are trapped between the housing halves.

The LGA interconnect grounding clip may be grounded to the substrate through the integral tabs. The grounding clip may include a planar wall portion which substantially covers an outer wall of the housing assembly. The grounding clip may include spring members extending from upper and lower ends of the planar wall portion.

The LGA interconnect housing assembly may be rectangular and include a grounding clip along all of the outer walls.

DETAILED DESCRIPTION OF THE PREFERRED EMBODIMENT

The subject invention relates to a Land Grid Array (LGA) interconnect socket. When used herein, the term LGA is meant to define many different interconnects. For example, it could be interpreted to mean a chip interconnected to a printed circuit board. However, it can also mean a board to board interconnect. In this application, the invention will be described by way of an interconnect to a chip.

Figure 1:
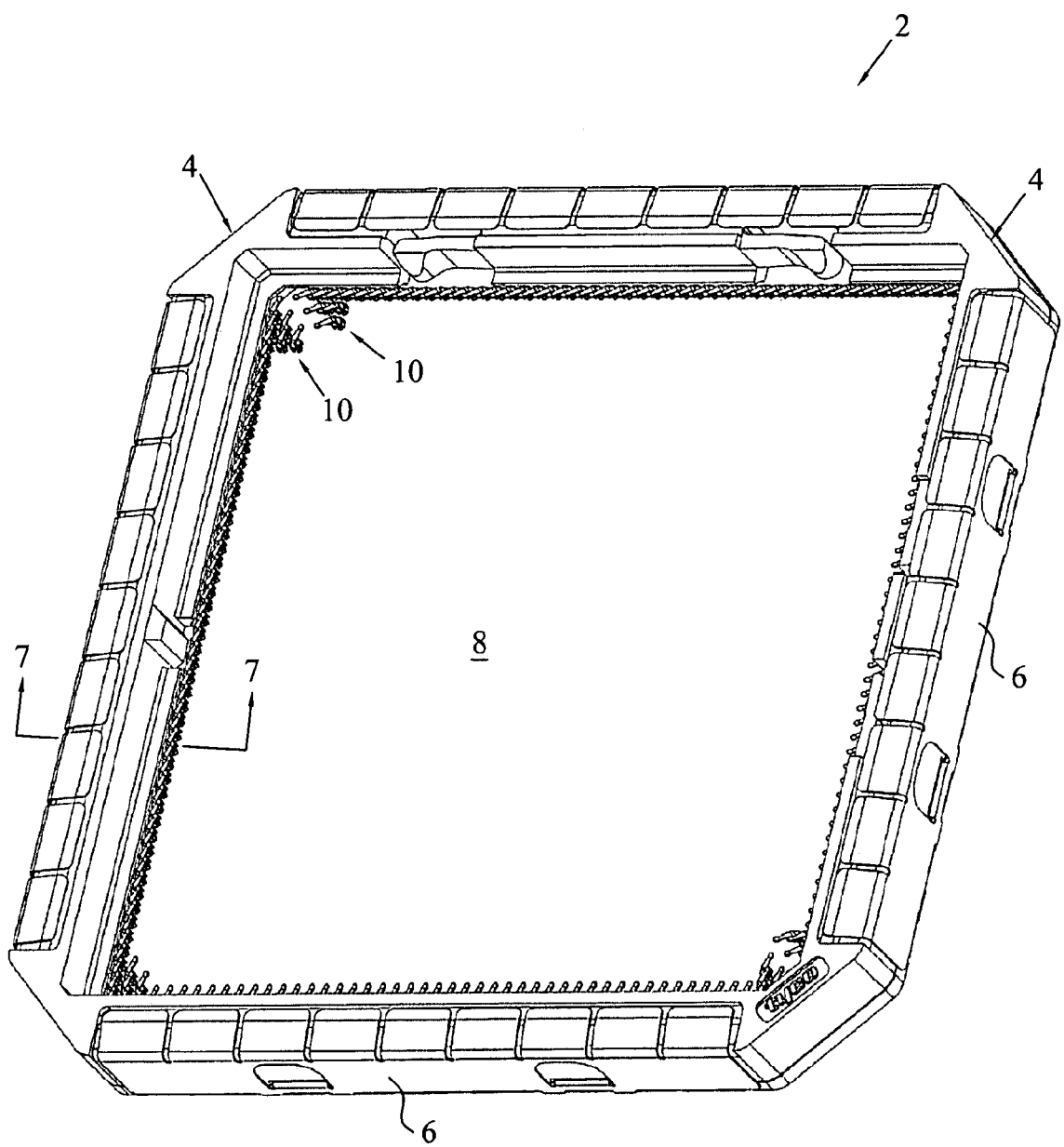
FIG. 1 is a top plan view of the LGA interconnect of the present invention.

With reference first to FIG. 1, LGA interconnect 2 is shown as including an insulative housing assembly, shown generally as 4, having a plurality of grounding clips 6 positioned about a periphery of the housing assembly 4. The housing assembly 4 retains and aligns a substrate 8 thereto, where substrate 8 holds a plurality of contact assemblies 10 in a fixed array as shown. Substrate 8 and contact assemblies 10 are shown in greater detail in pending U.S. patent application Ser. No. 10/788,880, incorporated herein by reference.

Figure 2:
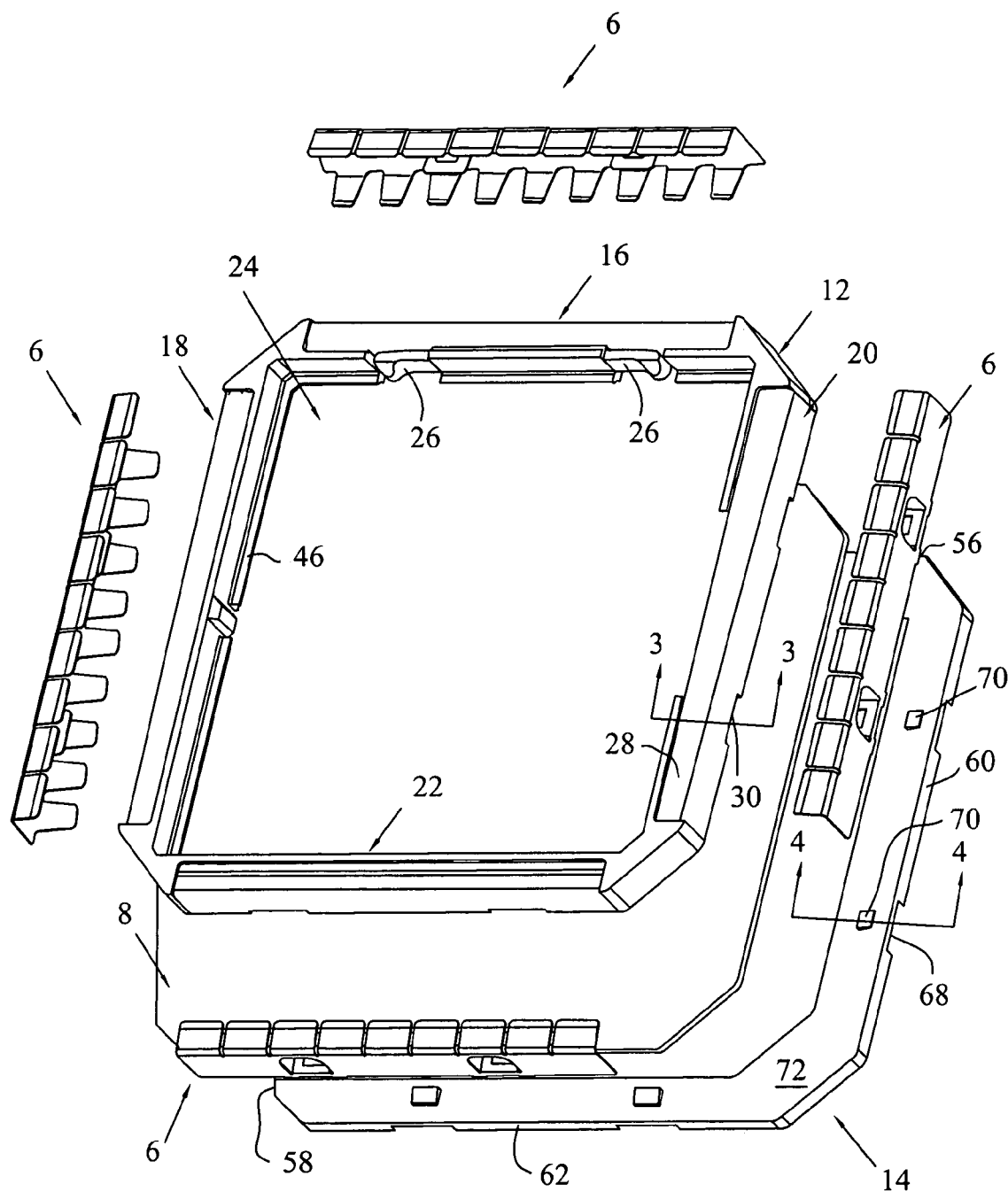
FIG. 2 is an exploded view of the LGA interconnect shown in FIG. 1.
Figure 3:
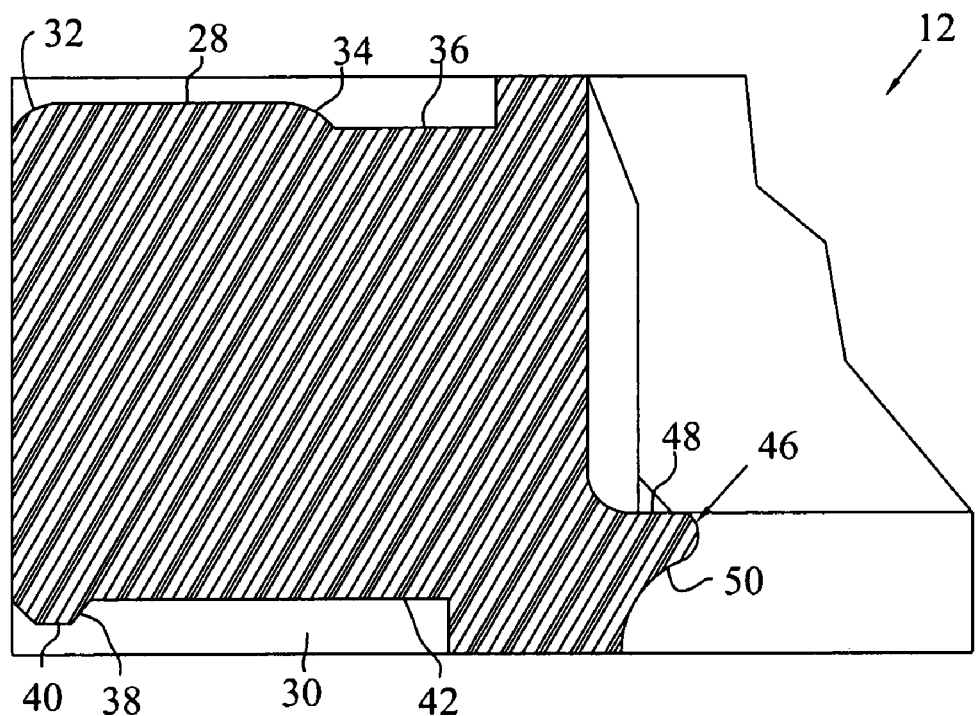
FIG. 3 is a cross-sectional view through lines 3—3 of FIG. 2.

With reference now to FIG. 2, housing assembly 4 is comprised of an upper housing portion 12 and a lower housing portion 14. As shown best in FIG. 2, upper housing portion 12 is comprised of four wall portions 16, 18, 20, and 22. Each of the walls taken together comprise a chip-receiving nest 24, as shown in FIG. 2. Preferably, at least one of the walls includes biasing springs 26, which can bias a chip placed in the nest into a proper position therein. As also shown in FIG. 2, housing portion 12 has a relief surface at 28 and a lower relief area at 30. Relief surface 28 is shown with more detail in FIG. 3, which is a cross section through lines 3—3 of FIG. 2. In FIG. 3, relief surface 28 is shown including a first radiused surface at 32, a second radiused surface at 34, and a lower surface 36. With reference still to FIG. 3, relief area 30 includes a lower lip portion 38 defining a contact surface 40 and an upper surface at 42, as will all be described herein in greater detail.

With respect again to FIG. 2, each of the walls 16–22 includes at least one support shelf shown generally at 46. With respect again to FIG. 3, shelf 46 includes a support surface at 48 and an arcuate section at 50, which will provide a protective surface for the contacts 10.

With respect again to FIG. 2, lower housing portion 14 includes complementary walls 56, 58, 60, and 62, which complement walls 16–22 of upper housing portion 12. With reference still to FIG. 2, lower housing portion 14 includes a relief area at 68 and a plurality of latches 70 positioned on an upper surface 72 thereof. With respect now to FIG. 4, which is a cross-sectional view through lines 4—4 of FIG. 2, latch 70 and relief area 68 are shown in greater detail. Relief area 68 includes a first radiused section 74 and a second radiused section 76 defining a lower surface at 78.

Figure 4:
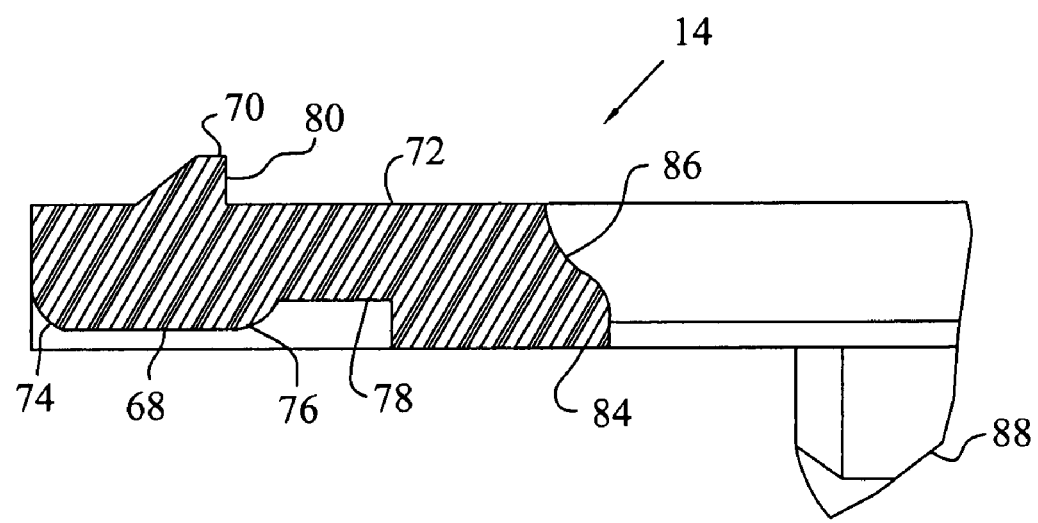
FIG. 4 is a cross-sectional view through lines 4—4 of FIG. 2.

Latch 70 also defines an inwardly directed latch face at 80. As also shown in FIG. 4, lower housing portion 14 includes an inverted shelf portion at 84 defining a complementary radiused surface at 86, which cooperates with radiused surface 50, as will be described herein. Finally, as shown in FIG. 4, a plurality of locating pins 88 are positioned in various positions along an undersurface of lower housing portion 14 for positioning on a complementary board.

Figure 7:
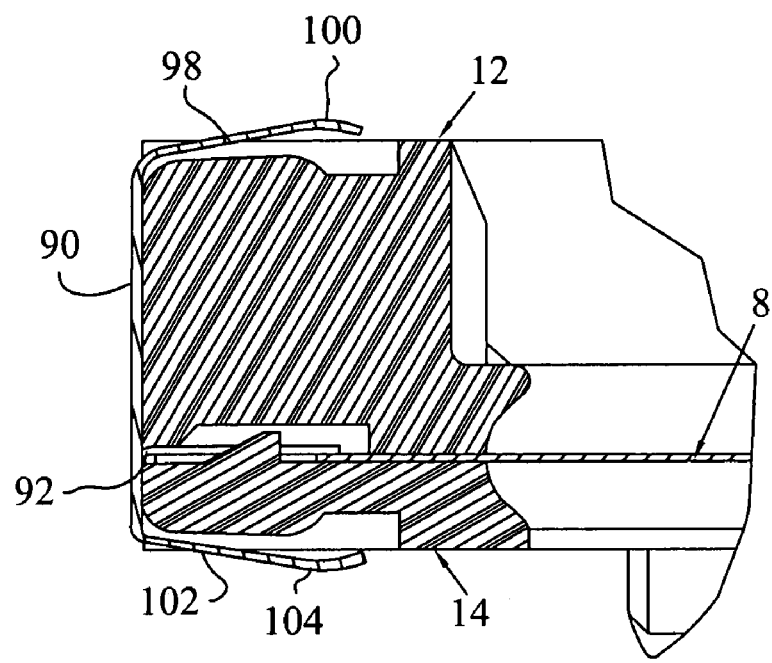
FIG. 7 is a cross-sectional view through lines 7—7 of FIG. 1.
Figure 5:
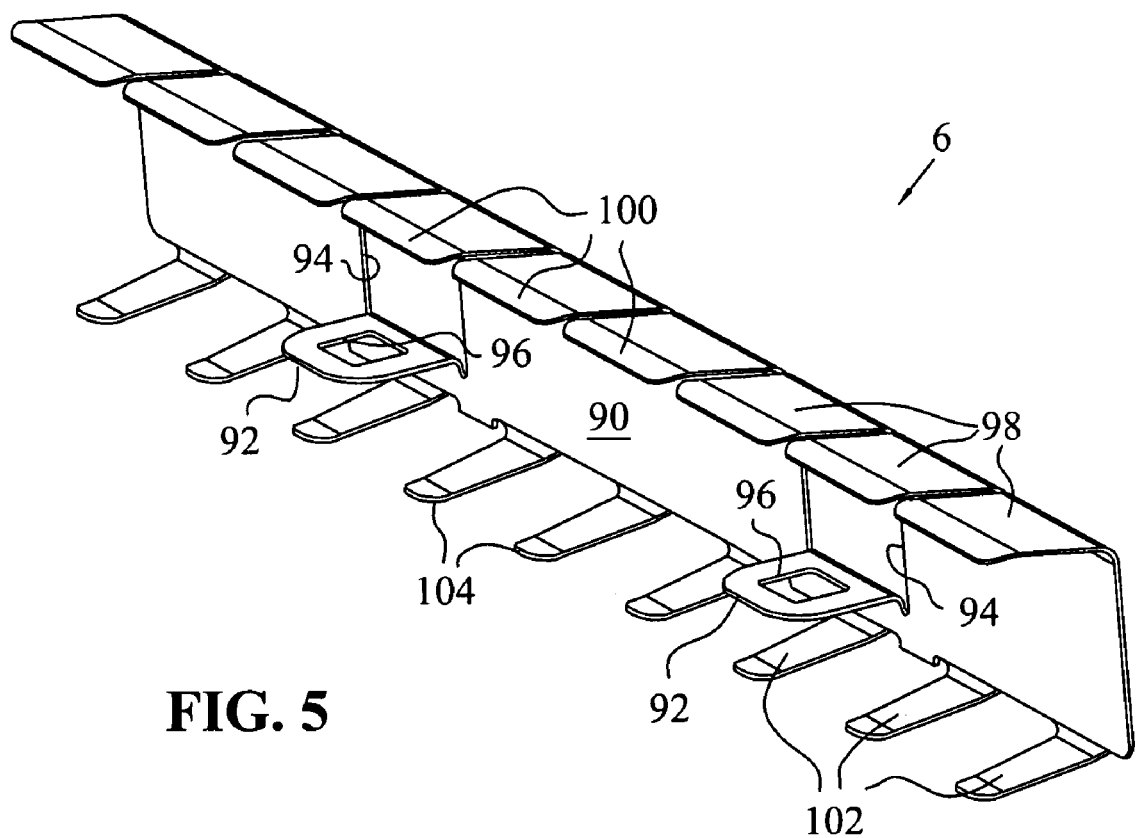
FIG. 5 is a perspective view of the grounding clip for use with the LGA interconnect of FIG. 1.

With respect now to FIG. 5, grounding clip 6 will be described in greater detail. Grounding clip 6 is generally comprised of a planar wall portion at 90, which includes integral tabs 92, which are struck from the planar wall portion 90, thereby defining windows at 94. Integral tabs 92 include locking apertures at 96, which will lock the grounding clips 6 to the housing assembly 4, as will be described in greater detail herein. With reference to FIGS. 5 and 7, grounding clip 6 includes upper spring members at 98, where each of the spring members 98 are curved inwardly adjacent their free ends to define contact portions at 100. Grounding clip 6 further includes lower spring members at 102 also having upwardly curve sections forming lower contact portions 104.

Figure 6:
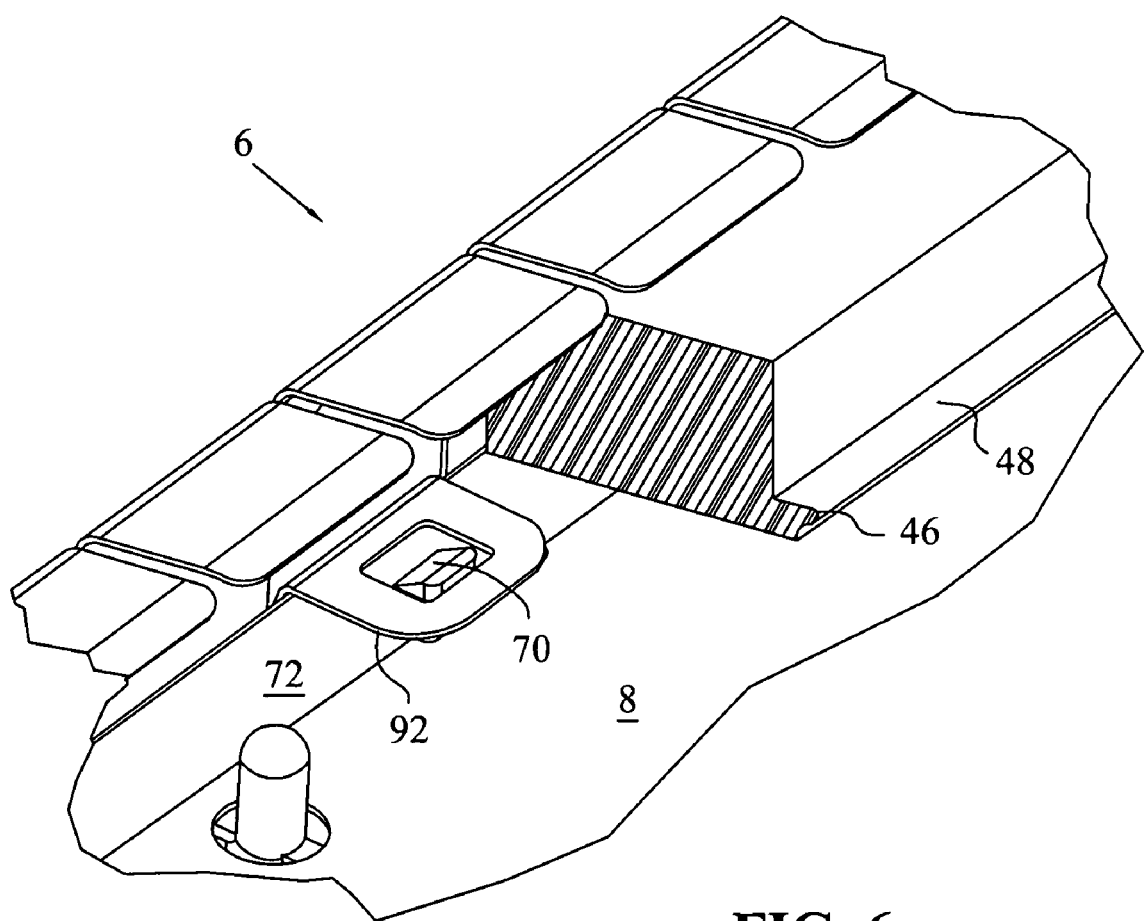
FIG. 6 is a partial cross-sectional view through the upper housing portion of the LGA interconnect of FIG. 1.

It should be appreciated then that the upper and lower 12, 14 housing portions can be positioned on opposite sides of substrate 8, as shown in either of FIG. 6 or 7, and grounding clips 6 can be positioned in relief area 30 (FIG. 3) such that integral tabs 92 are latched onto latch member 70. As can be shown in either of FIG. 6 or 7, grounding clip 90 is in contact with metal substrate 8, which electrically grounds the two together. This positions planar wall portion 90 against the upper and lower housing portions 12, 14 (FIG. 7) and thereby substantially covers the outer wall of the housing assembly. This also positions upper spring members 98 and lower spring members 102 adjacent to their relief surfaces 28 (FIG. 3), 68 (FIG. 4) in order for the spring members 98, 102 to bias towards its respective housing member.

As mentioned above, as the substrate is metal, there is a possibility that the electrical signals passing through the contacts may include electromagnetic waves, which propagate on the surface of the metal substrate, and that the noise from the waves could negatively affect the performance of the interconnection. Thus, the grounding clip performs two key functions to the assembly, first, it provides an EMI protection keeping EMI emissions out of the socket altogether. Secondly, the grounding clip 6 can dissipate the noise if such noise is propagated through the substrate, as mentioned above. As the grounding clips 6 can be shunted to chassis ground, the grounding clips are effective to eliminate multiple forms of interference.

What is claimed is:

1. An LGA interconnect, comprising a substrate and a plurality of contact assemblies, said substrate having said contact assemblies arranged in an array, each said contact assembly comprised of at least one metal contact being positioned on said substrate, positioning a first contact member of said metal contact above said substrate and a second contact member of said metal contact below said substrate, a housing assembly positioned around a substantial periphery of said substrate, and a grounding clip attached to said substrate and extending around a substantial portion of said housing assembly to protect said substrate from electromagnetic interference.

2. The LGA interconnect of claim 1, wherein said substrate is rigid.

3. The LGA interconnect of claim 2, wherein said rigid substrate is comprised of metal.

4. The LGA interconnect of claim 1, wherein said housing is insulative.

5. The LGA interconnect of claim 4, wherein said housing is comprised of two housing halves.

6. The LGA interconnect of claim 5, wherein said grounding clip includes integral tabs which are trapped between said housing halves.

7. The LGA interconnect of claim 6, wherein said substrate is metal and said integral tabs are grounded to said substrate.

8. The LGA interconnect of claim 6, wherein said grounding clip includes a planar wall portion which substantially covers an outer wall of said housing assembly.

9. The LGA interconnect of claim 7, wherein said grounding clip includes spring members extending from upper and lower ends of said planar wall portion.

10. The LGA interconnect of claim 8, wherein said housing assembly is rectangular and includes a grounding clip along all of said outer walls.

11. The LGA interconnect of claim 1, wherein said housing is comprised of two housing halves.

12. The LGA interconnect of claim 11, wherein a first housing half is located above said substrate and a second housing half is located below said substrate.

13. The LGA interconnect of claim 1, wherein the substrate is generally planar to define a first plane, the housing assembly generally defines a top plane and a bottom plane at the top and bottom of the housing, respectively, and the first plane is parallel to and located between the top and bottom planes.

14. An LGA interconnect, comprising:
a metal substrate having an upper surface and a lower surface;
a plurality of contact assemblies, each contact assembly comprised of at least one metal contact and an insulative member, said metal contacts being connected to the substrate by said insulative member; and
a conductive grounding clip attached to, and grounded to said substrate.

15. The LGA interconnect of claim 11, further comprising an insulative housing assembly positioned around a substantial periphery of said substrate.

16. The LGA interconnect of claim 15, wherein said insulative housing assembly is comprised of two housing halves.

17. The LGA interconnect of claim 16, wherein said grounding clip includes integral tabs which are trapped between said housing halves.

18. The LGA interconnect of claim 17, wherein said grounding clip is grounded to said substrate through said integral tabs.

19. The LGA interconnect of claim 14, wherein said grounding clip includes a planar wall portion which substantially covers an outer wall of said housing assembly.

20. The LGA interconnect of claim 19, wherein said grounding clip includes spring members extending from upper and lower ends of said planar wall portion.

21. The LGA interconnect of claim 20, wherein said housing assembly is rectangular and includes a grounding clip along all of said outer walls.

* * * * *